(12) United States Patent
Mustafa et al.

(10) Patent No.: US 10,592,623 B2
(45) Date of Patent: Mar. 17, 2020

(54) ASSERTION STATEMENT CHECK AND DEBUG

(71) Applicant: Mentor Graphics Corporation, Wilsonville, OR (US)

(72) Inventors: Moaz Magdy Mustafa, Cairo (EG); Mona Safar, Cairo (EG); Mohamed Dessouky, Cairo (EG)

(73) Assignee: Mentor Graphics Corporation, Wilsonville, OR (US)

( * ) Notice: Subject to any disclaimer, the term of this patent is extended or adjusted under 35 U.S.C. 154(b) by 235 days.

(21) Appl. No.: 15/362,510

(22) Filed: Nov. 28, 2016

(65) Prior Publication Data

US 2017/0161403 A1 Jun. 8, 2017

Related U.S. Application Data

(60) Provisional application No. 62/263,049, filed on Dec. 4, 2015.

(51) Int. Cl.
*G06F 17/50* (2006.01)

(52) U.S. Cl.
CPC .................. *G06F 17/504* (2013.01)

(58) Field of Classification Search
USPC ......................................... 716/106
See application file for complete search history.

(56) References Cited

U.S. PATENT DOCUMENTS

2007/0294651 A1* 12/2007 Tsai .................... G06F 17/5022
716/102

OTHER PUBLICATIONS

B. Keng, S. Safarpour, and A. Veneris, "Automated Debugging of SystemVerilog Assertions" in IEEE Design, Automation & Test in Europe Conference & Exhibition (DATE), Grenoble, France, Mar. 14-18, 2011, pp. 1-6.

(Continued)

*Primary Examiner* — Eric D Lee
(74) *Attorney, Agent, or Firm* — Mentor Graphics Corporation

(57) ABSTRACT

This application discloses a computing system to check and generate an assertion statement. The assertion statement, when executed during a simulation of a circuit design, can verify a simulated behavior of the circuit design. The computing system can extract sequence items from the assertion statement, and generate a state representation for the sequence items based on the simulated behavior of the circuit design. The state representation can identify states of the extracted sequence items at different clock ticks of the simulation. The computing system can locate an error in the assertion statement based on the state representation by generating patterns from sequence operators in the assertion statement and comparing the patterns to the state representation. The computing system can utilize the error in the assertion statement to generate a corrected assertion statement. The computing system can utilize propagate-and-repeat functionality to generate assertions by determining when to check each sequence item.

17 Claims, 6 Drawing Sheets

(56) References Cited

OTHER PUBLICATIONS

M. Siegel, A. Maggiore, and C. Pichler, "Untwist your brain—Efficient debugging and diagnosis of complex assertions", 46th ACM/IEEE Design Automation Conference(DAC), San Francisco—California, USA, Jul. 26-31, 2009, pp. 644-647.

I. Budiselic, S. Srbljic, and M. Popovic, "RegExpert: A Tool for visualization of regular expressions", The International Conference on Computer as a Tool (EUROCON), Warsaw, Poland, Sep. 9-12, 2007, pp. 2387-2389.

\* cited by examiner

ASSERTION STATEMENT CHECK AND DEBUG

RELATED APPLICATIONS

This application claim benefit of and priority to U.S. Provisional Patent Application No. 62/263,049, filed Dec. 4, 2015, which is incorporated by reference herein.

TECHNICAL FIELD

This application is generally related to electronic design automation and, more specifically, to checking and debugging assertion statements utilized in functional verification of circuit designs.

BACKGROUND

Designing and fabricating electronic systems typically involves many steps, known as a "design flow." The particular steps of a design flow often are dependent upon the type of electronic system, its complexity, the design team, and the fabricator or foundry that will manufacture the electronic system. Typically, software and hardware "tools" verify the design at various stages of the design flow by running software simulators and/or hardware emulators, and errors in the design are corrected or the design is otherwise improved.

Several steps are common to most design flows for electronic systems. Initially, the specification for a new electronic system is transformed into a logical design, sometimes referred to as a register transfer level (RTL) description of the electronic system. With this logical design, the electronic system can be described in terms of both the exchange of signals between hardware registers and the logical operations that can be performed on those signals. The logical design typically employs a Hardware Design Language (HDL), such as the Verilog, Very high speed integrated circuit Hardware Design Language (VHDL), or the like. The logic of the electronic system can be analyzed to confirm that it will accurately perform the functions desired for the electronic system. This analysis is sometimes referred to as "functional verification."

Functional verification often begins with a circuit design coded at a register transfer level (RTL), which can be simulated by a design verification tool. A designer, for example, utilizing the design verification tool can simulate circuit design and provide test stimulus to the simulated circuit design with a test bench. The designer also can utilize the design verification tool to execute assertion statements, which can compare values of simulated signals or other items in the simulated circuit design with conditions in the assertion statements. When the execution of the assertion statements indicate the simulated circuit design operates differently than expected, sometimes called an assertion statement failure, the designer can attempt to debug the circuit design. The design verification tool can record signal states and transitions of the circuit design, often called waveform data, which the designer can review in an attempt to identify a "bug" in the circuit design. The designer typically can utilize a debug tool to review the recorded waveform data in an attempt to locate and address the circuit design failure.

In some instances, the assertion statement failures may not identify a "bug" in the circuit design, but rather be a result of a defect in the assertion statement itself. Thus, the designer may spend time attempting to debug the circuit design when the error is actually located in the assertion statement.

Designers of the circuit design often debug failed assertion statements by introducing mutations to the failed assertion statements or by utilizing the recorded waveform data to evaluate the sequence items and conditions. The former debugging technique generates a large number of mutated assertion statements that can be filtered via a small-time-period simulation trace before being verified against simulation results. A resulting final list of mutated assertion statements can be consistent with the simulated behavior of the circuit design. The latter debugging technique depends on manual evaluations of assertion statement conditions to locate an error. Many design verification tools stop checking conditions in assertion statements during simulation of the circuit design in response to a violation of at least one of those conditions. Thus, once an error in an assertion statement is located and fixed, the designer re-runs a simulation of the circuit design to validate and help ensure that no other errors arise, for example, when a detection of an error was blocked by the previously detected error. The re-running of the simulation may be repeated iteratively until all errors in the assertion statements have been fixed.

SUMMARY

This application discloses tools or mechanisms, for example, implemented in a computing system, to check on an assertion statement and/or generate a corrected assertion statement. The assertion statements, when executed during a simulation of a circuit design, can verify a simulated behavior of the circuit design. The computing system can extract sequence items from an assertion statement, and generate a state representation for the sequence items based on the simulated behavior of the circuit design. The state representation can identify states of the extracted sequence items at different clock ticks of the simulation.

The computing system can manipulate the state representation and generate the corrected assertion statement based, at least in part, on the manipulated state representation. The computing system can locate an error in the assertion statement based on the state representation by generating patterns from sequence operators in the assertion statement and comparing the patterns to the state representation. The computing system can utilize the error in the assertion statement to modify the assertion statement, the state representation, or both to generate a corrected assertion statement matching design specifications. Embodiments will be described below in greater detail.

DESCRIPTION OF THE DRAWINGS

FIG. 3 illustrates an example of an assertion debug tool according to various embodiments.

FIGS. 4A-4C illustrate an example operation in an assertion debug tool for checking assertion statements based on verification results according to various examples.

DETAILED DESCRIPTION

Illustrative Operating Environment

Figure 1:
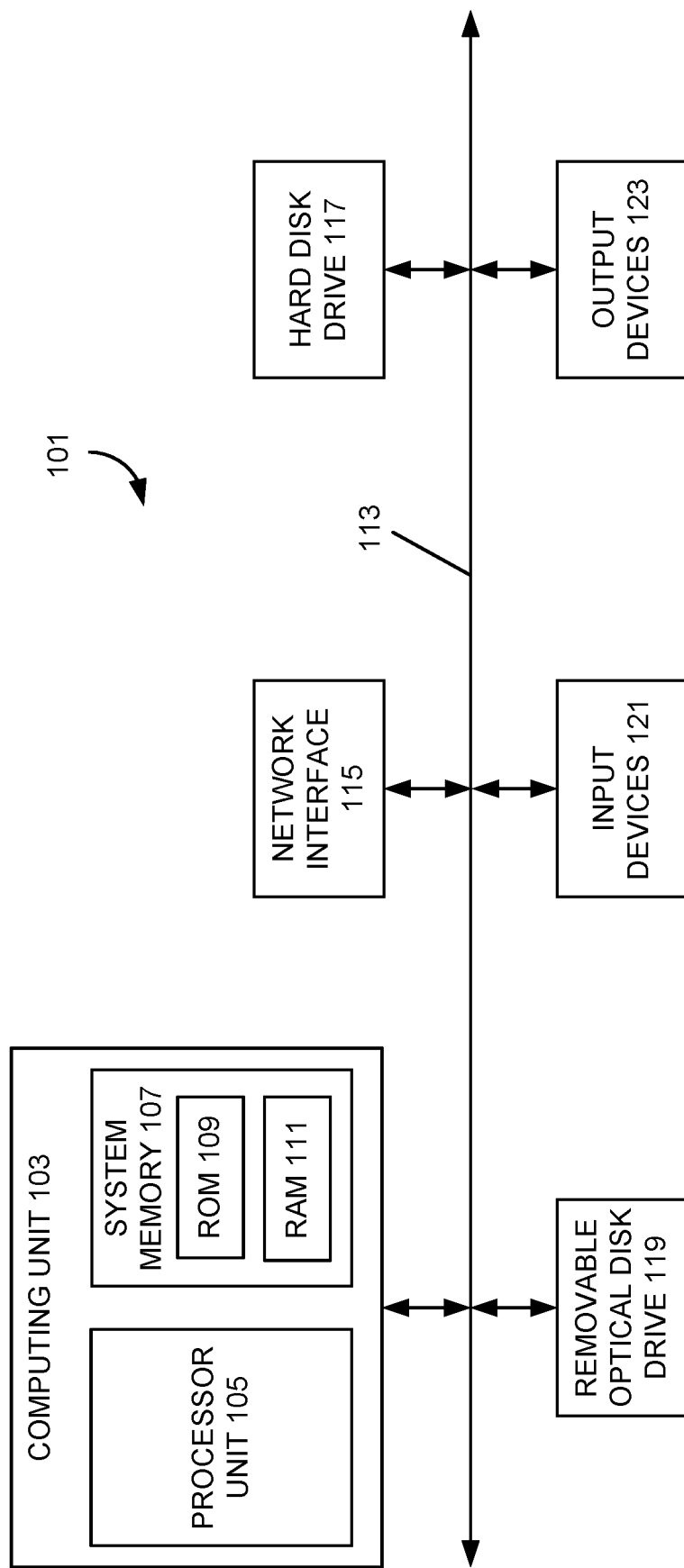
FIGS. 1 and 2 illustrate an example of a computer system of the type that may be used to implement various embodiments.

Various examples of the invention may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
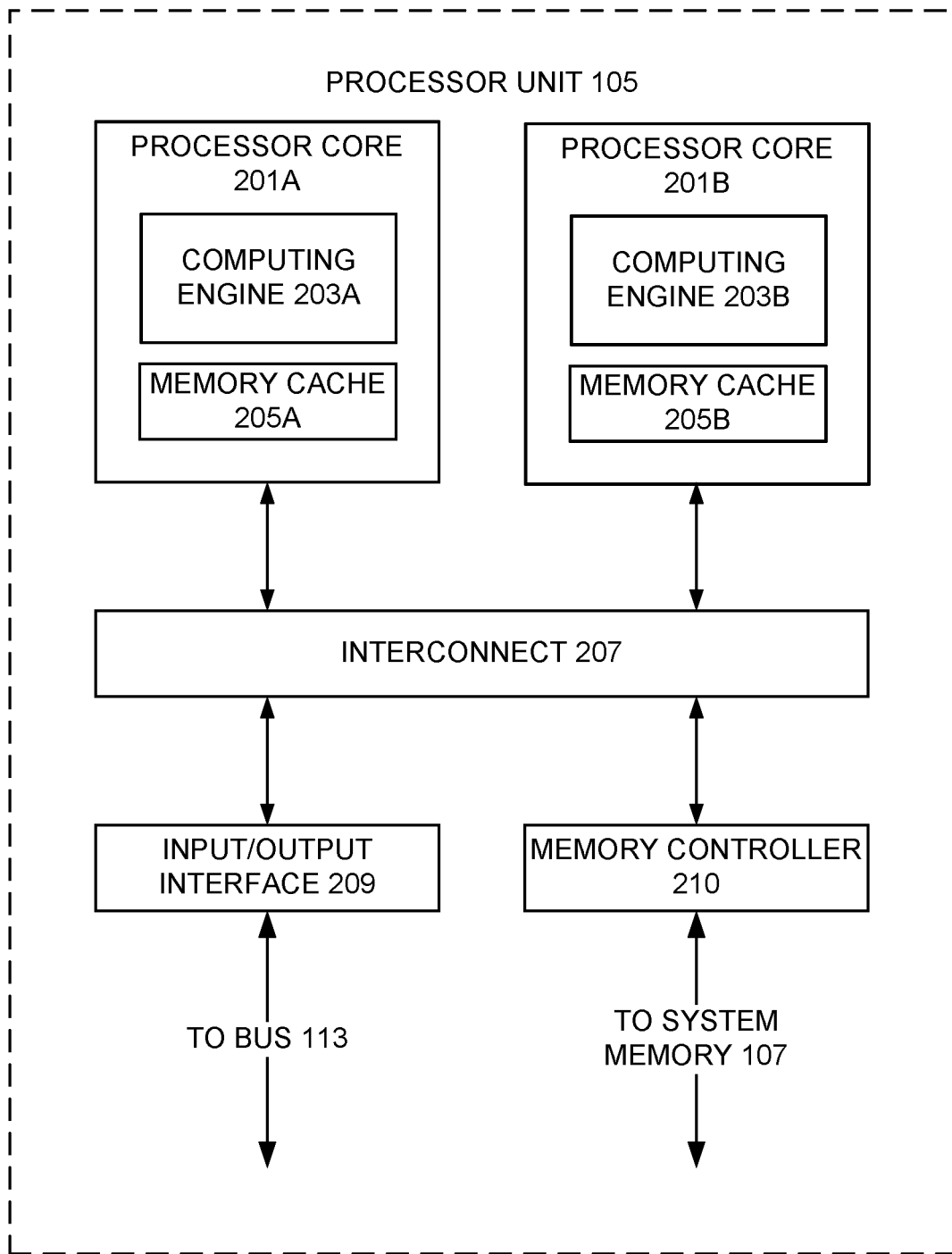

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations of the invention, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments of the invention.

Assertion Statement Check and Debug

FIG. 3 illustrates an example of an assertion debug tool 300 according to various embodiments. Referring to FIG. 3, the assertion debug tool 300 can receive verification results 301, for example, from a design verification tool implemented in a computing system, a hardware emulation device, a hardware prototype, a combination thereof, or the like. In some embodiments, the design verification tool can receive a circuit design, which can describe an electronic device both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with code in a hardware description language (HDL), such as Verilog, Very high speed integrated circuit Hardware Design Language (VHDL), or the like.

The design verification tool can implement a verification environment, for example, simulating, emulating, or hardware prototyping of the circuit design and a test bench. The test bench can define test stimuli, for example, clock signals, activation signals, power signals, control signals, and data signals that, when grouped, may form test bench transactions capable of prompting operation of the circuit design in the verification environment. In some embodiments, the test bench can be written in an object-oriented programming language, for example, SystemVerilog or the like. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench and verifying the circuit design. The design verification tool can record output, for example, verification results 301, created by the circuit design during operations in the verification environment. The verification results 301 can include waveform data, or results in other formats, such as a value change dump (VCD) file, or the like.

The design verification tool also can execute one or more assertion statements 302 in the verification environment, which can compare signals in the circuit design under verification, such as clock signals, activation signals, power signals, control signals, data signals, register states, operations, or the like, against one or more conditions defined in the assertion statements 302. The design verification tool can determine when the signals in the circuit design under verification fail to meet one or more of the conditions in the assertion statements 302.

The assertion debug tool 300 can receive the assertion statements 302, for example, having conditions that the circuit design under verification failed to meet in the verification environment. In some embodiments, the assertion statements 302 can be concurrent SystemVerilog assertions (SVA), which can be executable statements to prompt the design verification tool to compare operations associated with the circuit design against the conditions in the concurrent SystemVerilog assertions.

The assertion debug tool 300 can include a state representation generation unit 310 to generate an assertion state representation 303 for each of the assertion statements 302. The state representation generation unit 310 can parse the assertion statements 302 to identify one or more of the conditions or sequence items in the conditions. The state representation generation unit 310 can compare the one or more conditions from the assertion statements 302 to the verification results 301, for example, to determine whether the sequence items in the conditions were true, false, and possibly disabled at different clock ticks in the verification environment. In some embodiments, the state representation generation unit 310 can build a table, for example, in a row-column format, with the sequence items corresponding to rows and clock ticks in the verification environment corresponding to the columns. The intersections of the rows and columns can include a state identifier, which can indicate whether each sequence item was true, false, or possibly disabled at different clock ticks of the circuit design under verification. Table 1 shows an example implementation of the state identifiers and the associated sequence item state for inclusion in the assertion state representation 303.

TABLE 1

| State Identifier | Sequence Item State |
|---|---|
| "0" | FALSE |
| "1" | TRUE |
| "X" | DISABLED |

The assertion debug tool 300 can output the assertion state representation 303, which can be utilized to debug the assertion statements 302, for example, to determine whether a failure of the assertion statements 302 was due to at least one bug in the circuit design under verification or due to one or more bugs in the assertion statements 302.

The assertion debug tool 300 can include an assertion check unit 320 to determine the assertion statements 302 fail to conform to the behavior of the circuit design under verification by locating at least one error in the assertion statements 302 based, at least in part, on the assertion state representation 303. In some embodiments, the assertion check unit 320 can include a pattern generation unit 322 to generate one or more patterns based on the conditions in the assertion statements 302. For example, the pattern generation unit 322 can parse the assertions statements 302 to identify sequence operators, which can identify when each sequence item in the assertion statements 302 should be checked. The pattern generation unit 322 can convert the sequence operators into one or more regular expressions, and then utilize the regular expressions to generate the patterns. In some embodiments, the pattern generation unit 322 can organize the patterns into different pattern groups based on the sequence operators in the assertion statements 302.

The assertion check unit 320 can include a pattern matching unit 324 to compare the patterns generated by the pattern generation unit 322 to the assertion state representation 303. In some embodiments, a computing system implementing the assertion debug tool 300 can check patterns from the same pattern groups in parallel. The pattern matching unit 324 can determine when a pattern matches the assertion state representation 303 based on the comparison. When no pattern within a pattern group defined by the pattern generation unit 322 matches the assertion state representation 303, the pattern matching unit 324 can generate an output, which can be utilized to identify the unmatched pattern groups, as well as one or more clock ticks corresponding to the unmatched pattern groups. Embodiments of assertion statement checking utilizing pattern matching will be described below in greater detail.

The assertion check unit 320 can utilize outputs generated by the pattern matching unit 324 to identify a sequence item or a thread corresponding to the pattern group that violates the behavior of the circuit design under verification. The assertion check unit 320 can generate assertion check information 304, which can identify the sequence item or the thread as the cause of the failure of the assertion statements 302. In some embodiments, the assertion check information 304 also can include a presentation for a filtered version of the assertion state representation 303, for example, corresponding to the identified threads, and include statistics corresponding to the pattern groups, such as the number of times each clock tick was matched, or the like, which can facilitate further debugging of the assertion statements 302.

The assertion debug tool 300 can include an assertion correction unit 330 to determine the assertion statements 302 fail to conform to the behavior of the circuit design under verification by generating modified assertion information 305, which can comply with the behavior of the verification results 301. In some embodiments, the assertion correction unit 330 can implement propagate-and-repeat functionality to determine when conditions in the assertions statements 302 should be checked in order to become passing assertion statements. Since a non-failing assertion statement includes sequence items having a "true" state at specific clock ticks for the circuit design under verification, the assertion correction unit 330 can utilize the assertion state representation 303 to determine when each sequence items should be checked to have a passing assertion statement. The assertion correction unit 330 can utilize the results of this determination to identify corresponding sequence operators, which can be included in the modified assertion information 305.

In some embodiments, the assertion correction unit 330 can utilize the assertion state representation 303 directly, for example, bypassing the assertion check unit 320, to generate the modified assertion information 305. For example, the assertion correction unit 330 can utilize the assertion state representation 303 to generate one or more passing assertion statements, which can be included in the modified assertion information 305. The assertion correction unit 330 also can compare the passing assertion statements with the assertion statements 302 received by the assertion debug tool 300 to determine whether the assertion statements 302 would match a behavior of the circuit design under verification. Embodiments of the propagate-and-repeat functionality will be described below in greater detail.

Figure 4A:
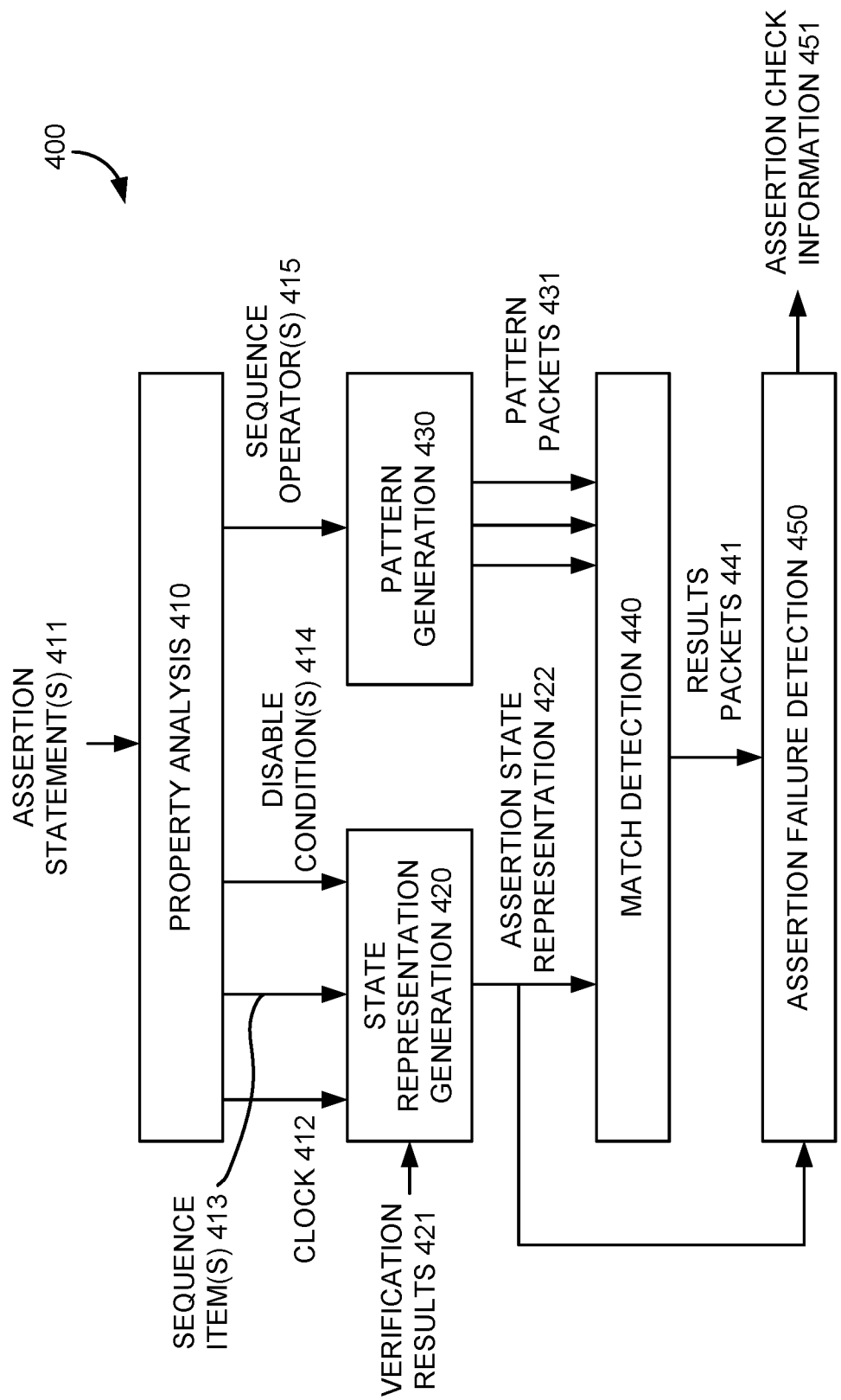
Figure 5:
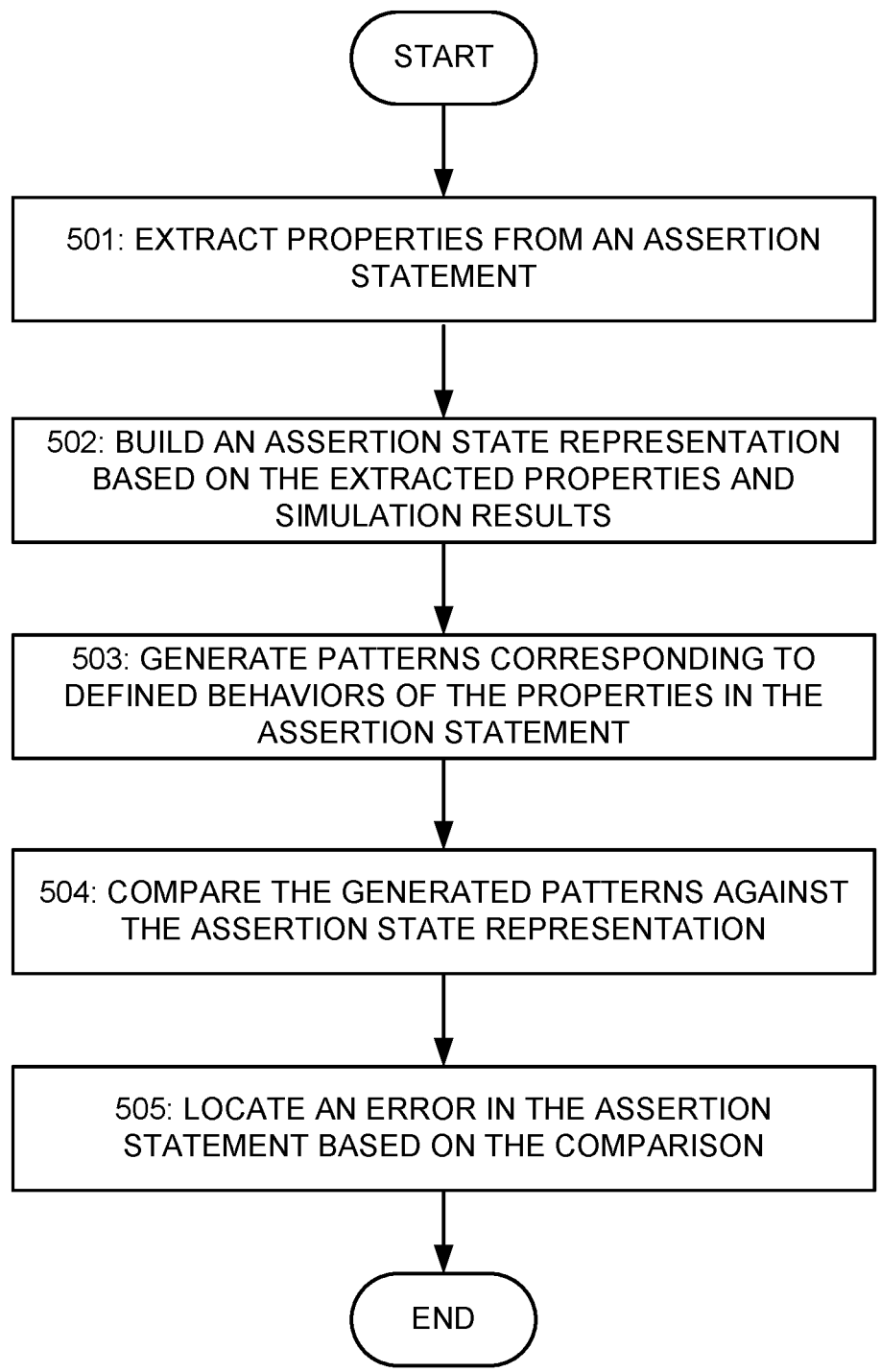
FIG. 5 illustrates an example flowchart for checking assertion statements based on verification results according to various examples.

FIGS. 4A-4C illustrate an example operation in an assertion debug tool for checking assertion statements based on verification results according to various examples, and FIG. 5 illustrates an example flowchart for checking assertion statements based on verification results according to various examples. Referring to FIGS. 4A and 5, the assertion statement check 400 can include operations associated with property analysis 410, which can parse one or more assertion statements 411. In some embodiments, the assertion statements 411 can be concurrent SystemVerilog assertions (SVA) that, when executed, can identify which operations of a circuit design under verification failed to conform to conditions in the concurrent SystemVerilog assertions.

In a block 501, the assertion debug tool can extract properties from an assertion statement. For example, the operations associated with the property analysis 410 can extract different portions of the assertion statements 411, such as an identification of a clock 412 associated with the circuit design under verification, one or more sequence items 413 corresponding to signals in the circuit design under verification, one or more disable conditions 414 configured to identify which clock ticks of the clock 412 to disable the conditions in the assertion statements 411, and sequence operators 415 configured to define temporal relationships between application of the sequence items 413 in the conditions of the assertion statements 411.

The assertion statement check 400 can include operations associated with state representation generation 420, which can receive the clock 412, the sequence items 413, and the disable conditions 414 from the property analysis 410. The operations associated with the state representation generation 420 also can receive verification results 421, for example, from a design verification tool. In some embodiments, the verification results 421 can include recorded signal values or states associated with the circuit design under verification, such as clock signals, activation signals, power signals, control signals, data signals, register states, operations, or the like.

In a block 502, the assertion debug tool can build an assertion state representation based on the extracted properties and simulation results. For example, the operations associated with the state representation generation 420 can generate an assertion state representation 422 for each of the assertion statements 411, for example, based on the verification results 421 from a design verification tool, the clock 412, the sequence items 413, and the disable conditions 414. The operations associated with the state representation generation 420 can compare the clock 412, the sequence items 413, and the disable conditions 414 from the property analysis 410 to the verification results 421, for example, to determine whether the sequence items 413 at clock ticks corresponding to the clock 412 were true, false, or disabled based on the disable conditions 414. In some embodiments, the operations associated with the state representation generation 420 can build the assertion state representation 422 as a table, for example, in a row-column format, with the sequence items 413 corresponding to rows and clock ticks corresponding to the clock 412 in the verification environment corresponding to the columns. The intersections of the rows and columns can include a state identifier, which can indicate whether each sequence item 413 was true, false, or disabled in the circuit design under verification.

The assertion statement check 400 can include operations associated with pattern generation 430, which can receive the one or more sequence operators 415 parsed from the assertion statements 411. In a block 503, the assertion debug tool can generate patterns corresponding to defined behaviors of the properties in the assertion statement. For example, the operations associated with the pattern generation 430 can generate one or more pattern packets 431 having patterns equivalent to the conditions in the assertion statements 411 based, at least in part, on the sequence operators 415. The sequence operators 415 can include repetition, implication, cycle delays, or the like, which can define temporal relationships between application of the sequence items 413 in the assertion statements 411. The pattern packets 431 can include patterns configured to model the conditions in the assertion statements 411, which can be subsequently matched to the assertion state representation 422.

Referring to FIG. 4B, the pattern packet 431 can be formatted to include multiple fields capable of population by the operations of the pattern generation 430 in FIG. 4A. The fields in the pattern packet 431 can include a pattern group number 432, a sequence item number 433, a pattern 434, and a clock tick number 435. The pattern group number 432 can be populated with a value configured to identify a pattern group defined by the operations of the pattern generation 430 in FIG. 4A. The sequence item number 433 can be populated with a value configured to identify a sequence item associated with a sequence operator utilized by the operations of the pattern generation 430 in FIG. 4A to generate the pattern 434. In some embodiments, a combination of a value populated in the pattern group number 432 and a value populated in the sequence item number 433 can provide an identifier for the pattern 434. The pattern 434 can be populated with a regular expression configured based on the sequence operator(s). The clock tick number 435 can be populated with a value configured to identify a number of contiguous clock ticks in the assertion state representation 422 to utilize in a subsequent match of the patterns 434 defined in a single pattern group.

Referring back to FIGS. 4A and 5, the operations associated with the pattern generation 430 can convert the sequence operators 415 into one or more regular expressions, for example, based on Table 2:

| Sequence Operator Name | Sequence Operator Type | Regular Expression |
|---|---|---|
| Cycle Delay | ## [N:M] | <[01X] {N, M}> |
| | ## [N] | <[01X] {N}> |
| Consecutive | [*N:M] | <{N, M}> |
| Repetition | [*N] | <{N}> |
| Implication | –> | <"0" and neglect remaining sequence or "1 [01X] {0}"> |
| | => | <"0" and neglect remaining sequence or "1 [01X] {1}"> |

The operations associated with the pattern generation 430 can utilize the regular expressions to generate the patterns in the pattern packets 431. The operations associated with the pattern generation 430 also can convert clock tick delays described by the sequence operators 415 into a clock tick value associated with a start of a thread for the sequence. The operations associated with the pattern generation 430 can define at least one pattern group, and generate zero or one pattern for each sequence item 413 in each pattern group. Each pattern group can be equivalent to a sequence, such as a combination of sequence items 413 and sequence operators 415, in the assertion statements 411.

In some embodiments, the operations associated with the pattern generation 430 can split one of the sequences to generate multiple pattern groups based on the sequence operators 415. For example, when the sequence operators 415 in the assertion statement 411 includes more than one range repetition operator, the operations associated with the pattern generation 430 can generate each pattern group to include one range repetition in each pattern group. In another example, when the sequence operators 415 include more than one range cycle delay operator, the operations associated with pattern generation 430 can generate pattern groups to include one range cycle delay operator in each pattern group.

In a block 504, the assertion debug tool can compare the generated patterns against the assertion state representation. For example, the assertion statement check 400 can include operations associated with match detection 440 to compare the pattern packets 431 to the assertion state representation 422, which can determine whether behavior of the circuit design under verification matches the patterns in the pattern packets 431. In some embodiments, when the patterns in the pattern packets 431 do not match the behavior of the circuit design under verification as included in the assertion state representation 422, the operations associated with the match detection 440 can generate one or more results packets 441.

Referring to FIG. 4C, the results packet 441 may have an example format having multiple fields capable of population by the operations of the match detection 440 in FIG. 4A. The fields in the results packet 441 can include a pattern group number 442, a sequence item number 443, and a clock tick identifier 444. The pattern group number 442 can be populated with a value configured to identify a pattern group defined by the operations of the pattern generation 430 in FIG. 4A. The sequence item number 443 can be populated with a value configured to identify a sequence item associated with a sequence operator utilized by the operations of the pattern generation 430 in FIG. 4A to generate the pattern 434 in the pattern packet 431 shown in FIG. 4B. In some embodiments, a combination of a value populated in the pattern group number 442 and a value populated in the sequence item number 443 can provide an identifier for the pattern 434 in the pattern packet 431 shown in FIG. 4B. The clock tick identifier 444 can be populated with one or more values configured to identify, which of the clock ticks in the assertion state representation 422 that did not match the pattern 434 in the pattern packet 431 as shown in FIG. 4B.

Referring back to FIGS. 4A and 5, the assertion statement check 400 can include operations associated with assertion failure detection 450, which can receive the results packets 441 from the match detection 440 operations and receive the assertion state representation 422 from the state representation generation 420 operations. In a block 505, the assertion debug tool can locate an error in the assertion statement based on the comparison. For example, the operations associated with the assertion failure detection 450 can utilize the results packets 441 to determine which threads associated with the assertion statements 411 failed to match behavior of the circuit design under verification.

The operations associated with the assertion failure detection 450 can utilize the values in the pattern group field and the sequence item field of the results packet to identify a sequence or pattern. Since each thread of a sequence or a pattern can start at a different clock tick, the value(s) in the clock tick field can identify which of the threads corresponding to the sequence failed to match the behavior of the circuit design under verification.

The operations associated with the assertion failure detection 450 can determine which pattern groups in the results packets 441 match the behavior of the circuit design under verification. The operations associated with the assertion failure detection 450 can generate assertion check information 451 based on the determined matches to the pattern groups. When a pattern group does not have a match to the behavior of the circuit design under verification at a particular clock tick, the operations associated with the assertion failure detection 450 can determine all threads that start at that clock tick have failed. The assertion check information 451 can identify these failed threads. In some embodiments, the assertion state representation 422 can be filtered based on the failed threads to identify the unmatched threads, and the assertion check information 451 can identify the unmatched threads identified from the filtered version of the assertion state representation 422. The operations associated with the assertion failure detection 450 also can generate various statistics on the assertion statements 411 for inclusion in the assertion check information 451. For example, the statistics can identify the threads that have been determined to have failed, clock ticks when each packet group matched the behavior of the circuit design under verification, or the like.

Figure 6:
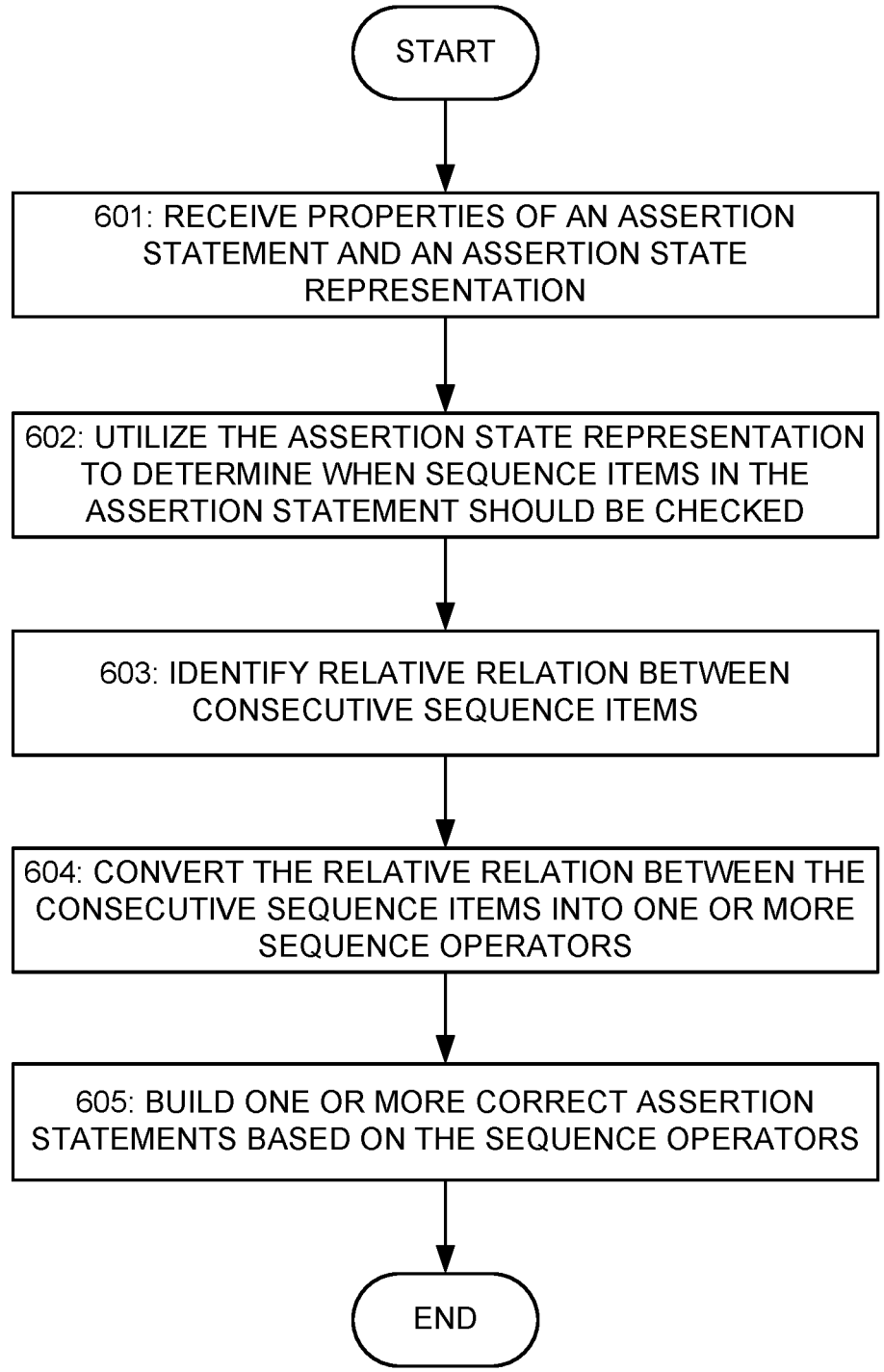
FIG. 6 illustrates an example flowchart for generating corrected assertion statements from an assertion state representation according to various examples.

FIG. 6 illustrates an example flowchart for generating corrected assertion statements from an assertion state representation according to various examples. Referring to FIG. 6, in a block 601, an assertion debug tool, implemented by a computing system, can receive properties of an assertion statement and an assertion state representation. In some embodiments, the assertion debug tool can analyze the assertion statement and extract the properties, such as a clock, sequence items, sequence operators, and disable conditions. In some embodiments, the assertion debug tool can generate the assertion state representation based on one or more of the properties in the assertion statement along with verification results, such as waveform data, a value change dump (VCD), or the like, from a simulation and/or emulation of a circuit design under verification.

In a block 602, the assertion debug tool can utilize the assertion state representation to determine when sequence items in the assertion statement should be checked. In some embodiments, the assertion debug tool can review states populated in the assertion state representation for the sequence items, and identify which of the clock ticks have a "true" state for each sequence item. The assertion debug tool can determine to check the sequence items at the clock ticks having a "true" state in the assertion state representation.

In a block 603, the assertion debug tool can identify relative relation between consecutive sequence items. In some embodiments, the assertion debug tool can determine the relative relation between the consecutive sequence items based, at least in part, on the determination of when the sequence items should be checked. The assertion debug tool also can determine the relative relation between the consecutive sequence items based, at least in part, on properties extracted from the assertion statement, such as the repetition defined for each sequence item, a cycled delay preceding an implication antecedent, or the like. The assertion debug tool also can determine the relative relation between the consecutive sequence items based, at least in part, on other properties, such as rules utilized to evaluate System Verilog assertion statements, or the like.

The assertion debug tool can identify the sequence items to check and then can perform one or more checks on the sequence items with different relative sequencing between the sequence items to determine which of the different relative sequencing between the sequence items would correspond to a passing assertion statement. In some embodiments, the assertion debug tool can adjust a cycle delay, repetition, or implication for the sequence items, which can alter the relative sequencing between the sequence items.

In a block 604, the assertion debug tool can convert the relative sequencing into one or more sequence operators. For example, the assertion debug tool can extract the cycle delay by determining a time difference between clock ticks for two consecutive sequence items. In another example, the assertion debug tool can extract the repetition type by determining a time difference between clock ticks of the same sequence item. The assertion debug tool can debug implications by replacing the implication with a cycle delay or by keeping the implication and adding a cycle delay, for example, by identifying a value of an antecedent of an implication at a specific clock tick determined by a constant cycle delay preceding the antecedent of the implication.

In an optional block 605, the assertion debug tool can build one or more correct assertion statements based on the sequence operators. In some embodiments, the assertion debug tool can utilize the sequence items, clock, and disable conditions from the initial failing assertion statement and modify the sequence operators from the initial failing assertion statement with newly converted sequence operators.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable memory device" (or alternatively, "machine-readable storage device") may include all of the foregoing types of memory, as well as new technologies of the future, as long as the memory device may be capable of storing digital information in the nature of a computer program or other data, at least temporarily, and as long at the stored information may be "read" by an appropriate processing device. The term "computer-readable" may not be limited to the historical usage of "computer" to imply a complete mainframe, minicomputer, desktop or even laptop computer. Rather, "computer-readable" may comprise any device that may be readable by a processor, a processing device, or any computing system. Such devices may be any available device that may be locally and/or remotely accessible by a computer or a processor, and may include volatile and non-volatile devices, and removable and non-removable devices, or any combination thereof.

A program stored in a computer-readable memory device may comprise a computer program product. For example, a memory device may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
extracting, by a computing system, sequence items from conditions in an assertion statement, wherein the assertion statement, when executed during a simulation of a circuit design, is configured to compare a simulated behavior of the circuit design against the conditions in the assertion statement;
generating, by the computing system, a state representation for the sequence items extracted from the assertion statement based, at least in part, on the simulated behavior of the circuit design, wherein the state representation is configured to identify states of the extracted sequence items at different clock ticks during the simulation of the circuit design; and
utilizing, by the computing system, the state representation for the sequence items to determine the simulated behavior of the circuit design failed to satisfy the conditions in the assertion statement, and determine the failure of the simulated behavior to satisfy the condition in the assertion statement was due to an error included in the assertion statement.

2. The method of claim 1, wherein utilizing the state representation for the sequence items further comprises:
generating different patterns corresponding to defined behaviors associated with the sequence items based, at least in part, on sequence operators from the assertion statement; and
comparing the different patterns to the state representation for the sequence items to identify the error in the assertion statement.

3. The method of claim 2, further comprising extracting, by the computing system, a disable condition from the assertion statement, wherein comparing the different patterns to the state representation for the sequence items further comprising excluding a portion of the state representation for the sequence items from the comparison based on the disable condition.

4. The method of claim 2, wherein utilizing the state representation for the sequence items further comprises, when one of the different patterns does not match to the state representation for the sequence items, generating a results packet configured to identify an unmatched pattern and at least one of the different clock ticks corresponding to the unmatched pattern.

5. The method of claim 1, wherein utilizing the state representation for the sequence items further comprises:
identifying a relative relation between consecutive sequence items in the assertion statement based, at least in part, on the state representation for the sequence items in the assertion statement; and
generating a different assertion statement based, at least in part, on a relative relation between consecutive sequence items, wherein the different assertion statement is configured to conform to the simulated behavior of the circuit design.

6. The method of claim 5, wherein generating the different assertion statement further comprises:
converting the relative relation between consecutive sequence items into sequence operators; and
building the different assertion statement to include the sequence operators from the conversion.

7. A system comprising:
a memory device configured to store machine-readable instructions; and
a computing system including one or more processing devices, in response to executing the machine-readable instructions, configured to:
extract sequence items from conditions in an assertion statement, wherein the assertion statement, when executed during a simulation of a circuit design, is configured to compare a simulated behavior of the circuit design against the conditions in the assertion statement;
generate a state representation for the sequence items extracted from the assertion statement based, at least in part, on the simulated behavior of the circuit design, wherein the state representation is configured to identify states of the extracted sequence items at different clock ticks during the simulation of the circuit design; and
utilize the state representation for the sequence items to determine the simulated behavior of the circuit design failed to satisfy the conditions in the assertion statement, and determine the failure of the simulated behavior to satisfy the condition in the assertion statement was due to an error included in the assertion statement.

8. The system of claim 7, wherein utilizing the state representation for the sequence items further comprises:
generating different patterns corresponding to defined behaviors associated with the sequence items based, at least in part, on sequence operators from the assertion statement; and
comparing the different patterns to the state representation for the sequence items to identify the error in the assertion statement.

9. The system of claim 8, wherein the one or more processing devices, in response to executing the machine-readable instructions, are configured to:
extract a disable condition from the assertion statement; and
exclude a portion of the state representation for the sequence items from the comparison based on the disable condition.

10. The system of claim 8, wherein the one or more processing devices, in response to executing the machine-readable instructions, are configured to generate a results packet when one of the different patterns does not match to the state representation for the sequence items, and wherein the results packet is configured to identify an unmatched pattern and at least one of the different clock ticks corresponding to the unmatched pattern.

11. The system of claim 7, wherein the one or more processing devices, in response to executing the machine-readable instructions, are configured to determine the assertion statement includes the error by:
identifying a relative relation between consecutive sequence items in the assertion statement based, at least in part, on the state representation for the sequence items in the assertion statement; and
generating a different assertion statement based, at least in part, on a relative relation between consecutive sequence items, wherein the different assertion statement is configured to conform to the simulated behavior of the circuit design.

12. An apparatus including a non-transitory memory device storing instructions configured to cause one or more processing devices to perform operations comprising:

extracting sequence items from conditions in an assertion statement, wherein the assertion statement, when executed during a simulation of a circuit design, is configured to compare a simulated behavior of the circuit design against the conditions in the assertion statement;

generating a state representation for the sequence items extracted from the assertion statement based, at least in part, on the simulated behavior of the circuit design, wherein the state representation is configured to identify states of the extracted sequence items at different clock ticks during the simulation of the circuit design; and utilizing the state representation for the sequence items to determine the simulated behavior of the circuit design failed to satisfy the conditions in the assertion statement, and determine the failure of the simulated behavior to satisfy the condition in the assertion statement was due to an error included in the assertion statement.

13. The apparatus of claim 12, wherein utilizing the state representation for the sequence items further comprises:

generating different patterns corresponding to defined behaviors associated with the sequence items based, at least in part, on sequence operators from the assertion statement; and comparing the different patterns to the state representation for the sequence items to identify the error in the assertion statement.

14. The apparatus of claim 13, wherein the instructions are configured to cause one or more processing devices to perform operations further comprising extracting a disable condition from the assertion statement, wherein comparing the different patterns to the state representation for the sequence items further comprising excluding a portion of the state representation for the sequence items from the comparison based on the disable condition.

15. The apparatus of claim 14, wherein generating the state representation for the sequence items is based, at least in part, on the simulated behavior of the circuit design and the disable condition.

16. The apparatus of claim 12, wherein utilizing the state representation for the sequence items comprises:

identifying a relative relation between consecutive sequence items in the assertion statement based, at least in part, on the state representation for the sequence items in the assertion statement; and generating a different assertion statement based, at least in part, on a relative relation between consecutive sequence items, wherein the different assertion statement is configured to conform to the simulated behavior of the circuit design.

17. The apparatus of claim 16, wherein generating the different assertion statement further comprises:

converting the relative relation between consecutive sequence items into sequence operators; and building the different assertion statement to include the sequence operators from the conversion.

* * * * *